(12) United States Patent
Egersdoerfer et al.

(10) Patent No.: US 9,061,811 B2
(45) Date of Patent: Jun. 23, 2015

(54) VENTING DEVICE

(76) Inventors: Lothar Egersdoerfer, Munich (DE);
Frank Jöpen, Herzogenrath (DE)

(*) Notice: Subject to any disclaimer, the term of this patent is extended or adjusted under 35 U.S.C. 154(b) by 946 days.

(21) Appl. No.: 13/142,864

(22) PCT Filed: Dec. 29, 2009

(86) PCT No.: PCT/EP2009/068006
§ 371 (c)(1),
(2), (4) Date: Jun. 30, 2011

(87) PCT Pub. No.: WO2010/076326
PCT Pub. Date: Jul. 8, 2010

(65) Prior Publication Data
US 2011/0275305 A1   Nov. 10, 2011

Related U.S. Application Data

(60) Provisional application No. 61/141,704, filed on Dec. 31, 2008.

(51) Int. Cl.
| | | |
|---|---|---|
| F24F 7/00 | (2006.01) | |
| F24F 13/00 | (2006.01) | |
| B65D 77/22 | (2006.01) | |
| F21V 31/03 | (2006.01) | |
| H05K 5/02 | (2006.01) | |
| F21S 8/10 | (2006.01) | |
| H02K 5/10 | (2006.01) | |

(52) U.S. Cl.
CPC ............. *B65D 77/225* (2013.01); *F21S 48/335* (2013.01); *F21V 31/03* (2013.01); *H02K 5/10* (2013.01); *H02K 2205/09* (2013.01); *H05K 5/0213* (2013.01)

(58) Field of Classification Search
USPC .......................................................... 454/339
IPC ........ H02K 8/10,2205/09; H05K 5/0213; B65D 77/225
See application file for complete search history.

(56) References Cited

U.S. PATENT DOCUMENTS 3,159,090 A * 12/1964 Schutt ........................... 454/270
3,909,302 A   9/1975 Mermelstein
(Continued)

FOREIGN PATENT DOCUMENTS

| EP | 1363069 | 11/2003 |
|---|---|---|
| EP | 1363484 | 11/2003 |

(Continued)

OTHER PUBLICATIONS

International Search Report PCT/EP2009/068006 dated Jun. 23, 2010.

*Primary Examiner* — Steven B McAllister
*Assistant Examiner* — Helena Kosanovic
(74) *Attorney, Agent, or Firm* — Amy L. Miller

(57) ABSTRACT

A venting device for insertion into an opening (2) of an enclosure having a wall (3) with an interior surface and an exterior surface comprises a body (11; 21; 31) having an insertion portion (12; 22; 32) for insertion into the opening (2) of the enclosure and a head portion (13; 23; 33). The body (11; 21; 31) has a passageway (14; 24; 34) that extends through the insertion portion (12; 22; 32) and the head portion (13; 23; 33) for passage of a fluid from the enclosure (7) to the ambient environment (6). The venting device further comprises an air permeable, water impermeable venting element (15; 25; 35) covering the passageway (14; 24; 34). An engagement section (16; 26; 36) is arranged circumferentially about the insertion portion (12; 22; 32) for engagement with the wall (3) of the enclosure. The engagement section (16; 26; 36) is radially deformable so as to provide a resisting force against withdrawal from the wall (3) when the venting device (10; 20; 30) is inserted in the opening (2), whereby the engagement section (16; 26; 36) is specifically adapted to permit insertion of the venting device (10; 20; 30) into openings of enclosures with different wall thicknesses.

13 Claims, 4 Drawing Sheets

(56) References Cited

U.S. PATENT DOCUMENTS

| | | | | |
|---|---|---|---|---|
| 4,184,414 | A | * | 1/1980 | Jarnot ........................ 454/275 |
| 5,522,769 | A | * | 6/1996 | DeGuiseppi ................ 454/270 |
| 6,170,684 | B1 | * | 1/2001 | Vincent et al. ............... 215/261 |

FOREIGN PATENT DOCUMENTS

| | | |
|---|---|---|
| EP | 1944247 | 7/2008 |
| GB | 2076380 | 12/1981 |

\* cited by examiner

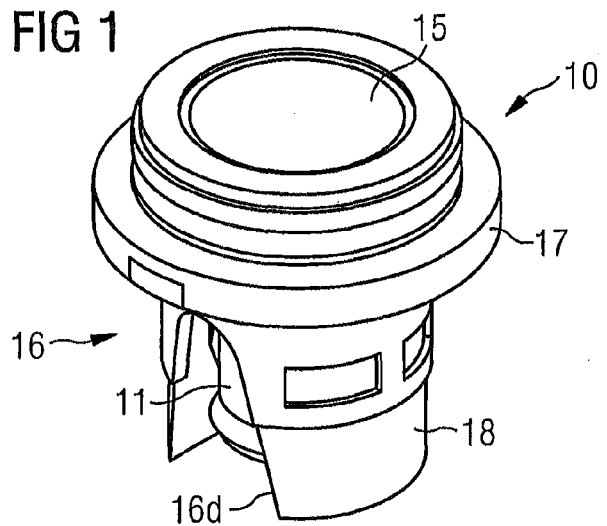
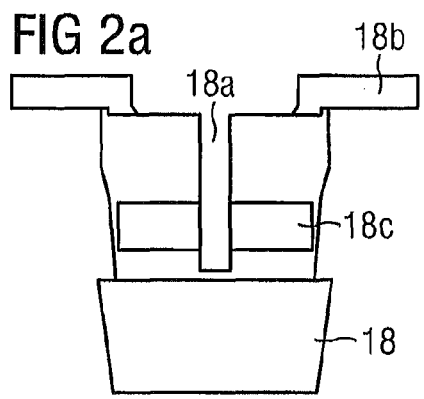
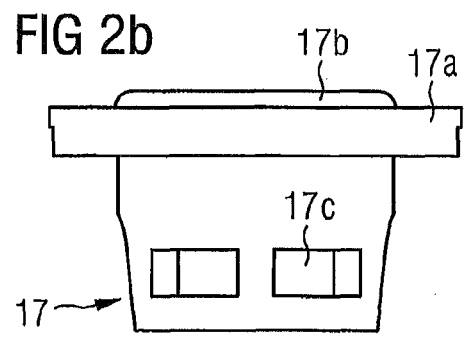
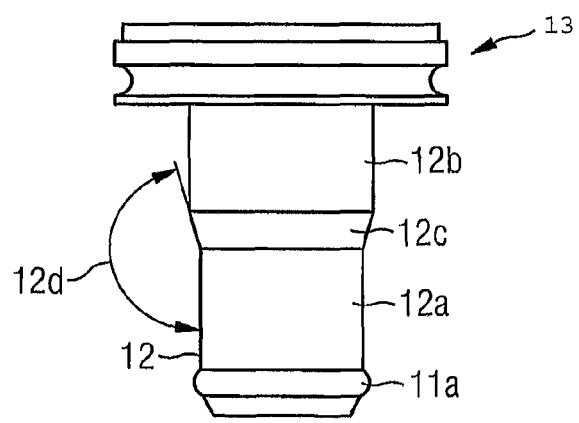

VENTING DEVICE

FIELD OF THE INVENTION

The present invention relates to a venting device for insertion into an opening of an enclosure. The device has unique engagement features which facilitate integration of the venting device into enclosures with differing wall thicknesses.

BACKGROUND OF THE INVENTION

Many enclosures require venting to relieve any pressure differential between the internal volume of the enclosure and the ambient environment. Such pressure differentials may be caused by temperature fluctuations, altitude changes, or the vapor pressure of any liquid contained within the enclosure. A venting device may advantageously include a porous material which allows gas flow for pressure equalization while preventing the entry of liquid and particulate contaminants. Sealed enclosures incorporating such venting devices have application in the automotive, electronic, medical, packaging and other industries.

Venting devices may be attached to enclosures by various means including interference fittings, threads or adhesives. These devices have incorporated barbs, threads and the like to facilitate attachment. However, each of these attachment means has disadvantages. For instance, some may not be easily integrated in enclosures of varying wall thicknesses and may require the use of additional attachment features. For example, a threaded attachment means may require a backing nut. Other means, such as barbed fittings, may require thick gaskets to compensate for wall thickness.

It is an object of the present invention to provide a venting device which can be easily inserted into openings of enclosures having different wall thicknesses.

SUMMARY OF THE INVENTION

According to the invention, a venting device is provided for insertion into an opening of an enclosure having a wall with an interior surface and an exterior surface and defining an interior space as opposed to ambient space.

The venting device has a body with an insertion portion and a head portion. The insertion portion is for insertion into the opening of the enclosure. The insertion portion of the body may be arranged to extend into the opening or may protrude through the opening of the enclosure into the enclosure, when the venting device is inserted in the opening of the enclosure. The head portion of the body may stay substantially outside the enclosure and may serve for example as a mounting portion for a cap and/or as an insertion stop.

The body of the venting device further comprises a passageway extending through the insertion portion and the head portion for passage of fluid from the interior space of the enclosure to the ambient environment. The passage-way is in particular for relieving any pressure differential between the internal volume of the enclosure and the ambient environment.

Furthermore, an air permeable, water impermeable venting element is provided and covers the passageway. The venting element is for preventing any liquid or other particulate contaminants from passing into the inside of the enclosure, while permitting pressure relief due to the air permeability of the venting element. The venting element may comprise a membrane and is preferably integrated in the head portion of the venting device.

The venting device further comprises an engagement section which is arranged circumferentially about the insertion portion. The engagement section is radially deformable so as to provide a resisting force against withdrawal from the wall when the venting device is inserted in the opening of the enclosure. Depending on the type of engagement, the radial deformation may consist in either radial widening or radial compression. The engagement section may engage with the wall of the enclosure for example in a form-fit or forcefit manner and may lock, nest, snap or engage with the wall in any suitable manner.

According to the invention, the engagement section is adapted to permit insertion of the venting device into openings of enclosures with different wall thicknesses. This way, the same venting device may be inserted into walls of different thickness without any modification of the venting device and will provide substantially the same properties, such as sufficient resisting force to prevent the venting device from falling off, and sufficient sealing to cause any communication between the interior space of the enclosure and the ambient environment to be effected substantially only through the passageway in the body of the venting device.

The venting device according to the invention may be attached to enclosures without any additional means such as adhesives or threads in the opening or on the body and also does not require any separate attachment features such as a backing nut or the like. It can be mounted into a wall of an enclosure from the outside fast and easily. The venting device according to the invention may also be IP68 waterproof up to 0.3 bar and resistant to vapor flow.

In a first preferred embodiment of the invention, the engagement section of the venting device has a composite construction. The composite construction of the venting device comprises a shank comprising a first polymer for insertion into the opening of the enclosure and a sealing portion comprising a second polymer. The first polymer has a first modulus of elasticity and the second polymer has a second modulus of elasticity, whereby the first modulus of elasticity is higher than the second modulus of elasticity.

The engagement section further has a bore extending through the sealing portion and the shank, whereby the bore has at least one groove and/or rib, which are advantageously arranged circumferentially within the bore. The insertion portion of the venting device has a section comprising at least one rib and/or groove for engagement with the at least one groove and/or rib, respectively, of the engagement section to create an interference fit between the engagement section and the body of the venting device. The groove-rib engagement allows an easy fit of the two parts without the need for any additional parts. The fit can be achieved without the application of strong forces but at the same time provides a secure fit.

Due to the composite construction, the engagement section is able to provide different properties, such as sealing properties, which may require a comparably soft material, as well as fixation properties, which may require a comparably hard material.

In an alternative embodiment, the engagement section may comprise the shank and the sealing portion as one integral piece. In this case the engagement section preferably comprises a relatively soft polymer material, which may correspond to the second polymer used for the sealing portion in the composite construction of the engagement section. In order to improve the interference fit between the rib of the insertion portion and the corresponding groove in the relatively soft engagement section, the rib may advantageously provide a cross-section which is able to act as a barb, e.g. a substantially triangular cross-section.

Preferably, the at least one groove and/or rib of the bore is arranged in the shank of the engagement section comprising the first, relatively hard polymer material. Due to the provision of the interference fit between the hard part of the engagement section and the body of the venting device, the connection between the two parts is relatively strong once the rib and groove are in engagement. Preferably, the modulus of elasticity of the body of the venting device is chosen to be at least as high as the modulus of the shank of the engagement section.

Preferably, the sealing portion radially widens when the insertion portion is inserted into the bore of the engagement section to create said resisting force against withdrawal of the venting device from the wall opening. In this manner, secure engagement of the venting device in walls of different thickness can be achieved without the need for additional parts or counterparts in the opening of the enclosure. Furthermore, upon radial widening of the engagement section's sealing portion, a circumferential sealing against the inside of the wall opening may be achieved.

The engagement section may comprise a flared end portion which preferably forms a part of the sealing portion. The flared end portion of the engagement section, i.e. a portion of the engagement section which has a larger outer diameter than the rest of the engagement section, serves as a stop for the venting device when the venting device is inserted into the opening of the enclosure so as to prevent the venting device from slipping through the opening into the enclosure. Furthermore, the flared end portion facilitates the insertion into the opening since it defines an accurate position of the venting device in the opening of the enclosure.

Preferably, the insertion portion to be fitted into the bore of the engagement section is stepped, providing a first diameter section and a second diameter section. The first diameter is smaller than a diameter of the bore and the second diameter is larger than a diameter of the bore, whereby the second diameter section is located closer to the head portion of the venting device than the first diameter section. The first, smaller diameter section facilitates insertion of the insertion portion into the bore and does not cause any radial widening of the sealing portion. The insertion portion can therefore be easily inserted into the bore to a certain extent. The second, larger diameter section, which is inserted after the first diameter section due to its location closer to the head portion, causes the sealing portion of the engagement section to widen radially. Due to the provision of sections with constant first and second diameters separated by a step instead of the provision of a tapered insertion portion, the sealing portion is constantly widened by the insertion portion in the area of the second diameter section. Thus, a constant pressure against the inside of the wall opening can be provided in the sealing area irrespective of the thickness of the wall.

The step between the first and second diameters of the insertion portion is preferably tapered to provide a smooth transition between the first and second diameter sections. This facilitates the insertion of the venting device's body into the bore of the engagement section.

The bore may comprise at least one second groove and/or at least one second rib for engagement with the rib and/or groove of the insertion portion to hold the insertion portion within the bore when the insertion portion is only partly inserted in the bore of the engagement section. This permits a pre-assembly of the engagement section and the body of the venting device, which are two separate parts. The sealing portion is not radially widened in the pre-assembled state, such that the venting device can easily be inserted into an opening of an enclosure. After the vent has been partly inserted into the opening, e.g. until a stop on the engagement section prevents any further axial movement of the engagement section into the wall opening, the insertion portion may be further advanced into the bore of the engagement section to create the final interference fit between the rib/groove of the insertion portion and the afore-mentioned (first) groove/rib in the bore of the engagement section. The second groove or rib in the bore of the engagement section may be arranged in the engagement section's sealing portion comprising the second polymer which is softer than the first polymer. In this manner, a detachable fit may be created at a first position in the bore (pre-assembled configuration) and no strong force is required for further inserting the insertion portion to the second position in the bore providing said interference fit.

In order to additionally provide an axial sealing between the sealing portion and the head portion, at least one of the sealing portion and the head portion advantageously comprises at least one circumferential ridge facing the respective other of the head portion and the sealing portion. The circumferential ridge is preferably comprised in the sealing portion. Axial sealing is then provided when the insertion portion is inserted in the bore and creates said interference fit. The positions of the rib and groove, in particular the distance of the groove/rib engagement from the head portion, may be appropriately chosen to press the head portion against the ridge of the sealing portion; which is preferably the flared end portion of the engagement section.

At least a section of the shank may be slit in an axial direction to provide radial elasticity. For instance, the proximal end of the shank, i.e. the part of the shank closest to the head portion of the venting device, may preferably be slit axially. In this manner, the shank—although it comprises the first, harder polymer—may radially widen when the insertion portion of the body is inserted into the bore of the engagement section by expanding the sealing portion and creating said resisting force. The shank may comprise for example two diametrically opposed slits extending from a proximal end of the shank towards a central part thereof so as to leave a circumferentially closed section of the shank at its distal end, i.e. at the part of the shank furthest away from the head portion of the venting device. The provision of the slit section to provide radial elasticity enables the shank to act as a dowel so as to enhance a tight fit in the opening upon spreading.

Preferably, the sealing portion is fitted over the shank to circumferentially surround the shank in an area of the slit section. Thus, the engagement section is circumferentially closed to improve the fit of the venting device in the opening of the enclosure. Since the sealing portion comprises the second, softer polymer, the radial elasticity of the slit section is maintained.

The engagement section, i.e. at least the shank and possibly also the sealing portion thereof, may additionally have at least one further axial slit extending from the engagement section's distal end towards a central part thereof. The distal end slit or slits are sufficiently long to interrupt the at least one groove or at least one rib of the bore. This provides radial elasticity of the distal end of the engagement section to facilitate the interference fit between the engagement section and the body of the venting device. The engagement section may have two diametrically opposing slit sections which may each amount to a quarter of the circumference of the shank at its distal end. Such relatively large slits or cut-outs in the engagement section facilitate insertion of the venting device into a wall opening. The recesses may narrow towards the head portion of the insertion portion and may axially extend along the major part of the length of the engagement section.

Preferably, the sealing portion comprises a thermoplastic elastomer material or rubber and the shank preferably comprises a thermoplastic polymer or copolymer selected from the group of polyethylene, polypropylene, polycarbonate, polyester, polyamide, polybutylene terephthalate. The body of the venting device may be made of the same material as the shank.

In a second preferred embodiment of the invention, the insertion portion comprises a structural core section and the engagement section. The engagement section comprises an elastic material having a lower modulus of elasticity than the structural core section. The engagement section further comprises a plurality of radial engagement members spaced apart along the length of the insertion portion and radially extending from the insertion portion.

The structural core section, which comprises a harder material than the engagement section, provides stability to the venting device, whereas the softer engagement section enables an appropriate fit of the venting device in an opening of an enclosure. By the provision of spaced apart engagement members, the venting device can be inserted into walls with different thicknesses, whereby some of the engagement members directly engage with the wall while others may pass beyond the wall during insertion.

Preferably, the cross-section of each engagement member reduces in width from a radially inner base to a radially outer free end of the engagement member and may be substantially triangular in each case. This results in a strong connection between the engagement members and the engagement section and reduces the risk of breaking of the engagement members, whereas the thin radially outer ends of the relatively soft engagement members facilitate the insertion of the venting device into an opening.

The surfaces of the engagement members facing the head portion may be substantially perpendicular to a longitudinal axis of the insertion portion. In contrast, the respective opposing surfaces of the engagement members are tapered so as to further facilitate insertion of the venting device into a wall opening. The surfaces perpendicular to the longitudinal axis act as a barb when the venting device is inserted into and through the wall opening. Advantageously, the radial engagement members form a saw-tooth profile on the engagement section and are pliable. Such soft engagement members allow easy insertion but impede or even prevent withdrawal of the venting device from the opening.

It is preferred that the engagement members radially extend from the insertion portion along the entire circumference of the insertion portion so as to provide radial sealing lips when the venting device is inserted in the opening of the enclosure. In this manner, no further sealing is needed. In particular, no axial sealing of the head portion of the venting device against the exterior surface of the wall using additional gaskets is needed. The engagement members offer both engagement of the venting device in the opening and sealing of the venting device against the inside of the wall of the enclosure. Even when the venting device is not sufficiently long to extend all the way through the wall opening into the enclosure and, therefore, none of the engagement members can act as a barb engaging with the rear side of the wall, the engagement members interacting with the inside of the wall opening still offer sufficient resistance against withdrawal from the opening, due to their form and pliability.

The engagement section may comprise three, preferably four and even more, preferably five, engagement members having a pitch of about 1 mm. This enables the venting device to be securely inserted into openings of walls with thicknesses in the range of 2, 3 or 4 mm.

Preferably, the engagement section and the engagement members comprise a thermoplastic elastomer material or rubber and the structural core comprises a thermoplastic polymer or copolymer selected from the group of polyethylene, polypropylene, polycarbonate, polyester, polyamide, polybutylene terephthalate.

In a third preferred embodiment of the invention, a venting device for insertion into an opening of an enclosure is provided wherein the engagement section has two or more radial locking elements extending radially from the insertion portion of the body of the venting device. The radial locking elements are for engagement with the interior surface of the wall, whereby at least two of the radial locking elements are positioned at differing distances from the head of the body.

The provision of locking elements at different distances from the head of the body allows the venting device to be inserted into walls with different thicknesses. The locking elements having a smaller distance from the head portion than the thickness of the wall are radially deformed when the venting device is inserted in the wall and may not contribute to engagement. The locking elements having a greater distance from the head portion than the thickness of the wall are in their undeformed condition but do not contribute to engagement either, because they do not touch the wall. Engagement is carried out merely by those engagement members whose distance from the head portion corresponds to the thickness of the wall. These engagement members are in their undeformed condition and engage with the interior surface of the wall in a barb-like manner.

Preferably, the radial locking elements are formed as flexural arms. Flexural arms permit easy bending and thus easy insertion of the venting device into the opening. The flexural arms preferably depend from the venting device at an acute angle so that they are almost parallel to the venting device's longitudinal axis and need only little deflection radially inwardly in order to slip through the wall opening. Nevertheless, sufficient hold of the venting device is achieved by the flexural arms when they return to their undeformed condition after having passed the wall during insertion of the venting device into so the wall opening.

In order to provide a uniform fit of the venting device in the opening, at least two, preferably three, radial locking elements are positioned at the same distance from the head of the body and are preferably arranged uniformly about the circumference of the insertion portion. By the provision of for example three locking elements equally spaced apart, i.e. at distances of about 120°, around the circumference of the insertion portion, the venting device is prevented from tilting within the opening. There may also be provided more than three locking elements having the same distance from the head portion. Locking elements positioned at a different distance from the head portion may be arranged slightly shifted from the locking elements at another distance so that their respective arms do not collide but extend parallel along the length of the insertion portion. Preferably, the locking elements are provided at three or four different distances, for example at 1 mm intervals, whereby locking elements at the same distance from the head portion are uniformly arranged about the circumference of the insertion portion.

The head portion may comprise an axially deformable gasket for axially sealing the head portion against the exterior surface of the wall of the enclosure. Preferably, the gasket is formed in a bellows-like manner and may account for at least 1 mm of axial compression. In combination with the radial locking elements being arranged at distances from the head portion in 1 mm intervals, the venting device is suitable for use not only in wall openings with a depth of e.g. 1, 2, 3 or 4 mm but also in wall openings having any thickness in-between. Thus, the axially deformable gasket provides sufficient sealing of the head portion against the exterior surface of the wall for walls with unknown thicknesses. It furthermore allows the venting device to be inserted slightly beyond the actually needed insertion depth so as to allow the active locking elements to return to their undeformed condition so as to act as a barb. The wall is then clamped between the gasket and the active locking elements at the respective distance from the head portion. Due to the axial sealing no radial sealing is needed.

Preferably, the body of the venting device comprises a thermoplastic polymer or copolymer selected from the group of polyethylene, polypropylene, polycarbonate, polyester, polyamide, polybutylene terephthalate.

In all aspects of the invention the air permeable, water impermeable venting element may comprise a porous membrane, preferably a PTFE membrane.

Preferably, the venting device of the present invention is adapted to be integrated into enclosures with wall thicknesses differing by at least up to 1 mm, preferably by up to 3 mm. In particular, the venting device is adapted to be integrated in enclosures with differing wall thicknesses from 1 mm to at least 4 mm.

BRIEF DESCRIPTION OF THE DRAWINGS

The advantages of the invention will be more fully understood from the accompanying figures and their description.

FIG. 1 is a perspective view of a first embodiment of a venting device,

FIGS. 2a, 2b and 2c are side views of three components constituting the first embodiment of a venting device.

DESCRIPTION OF THE INVENTION

Figure 3:
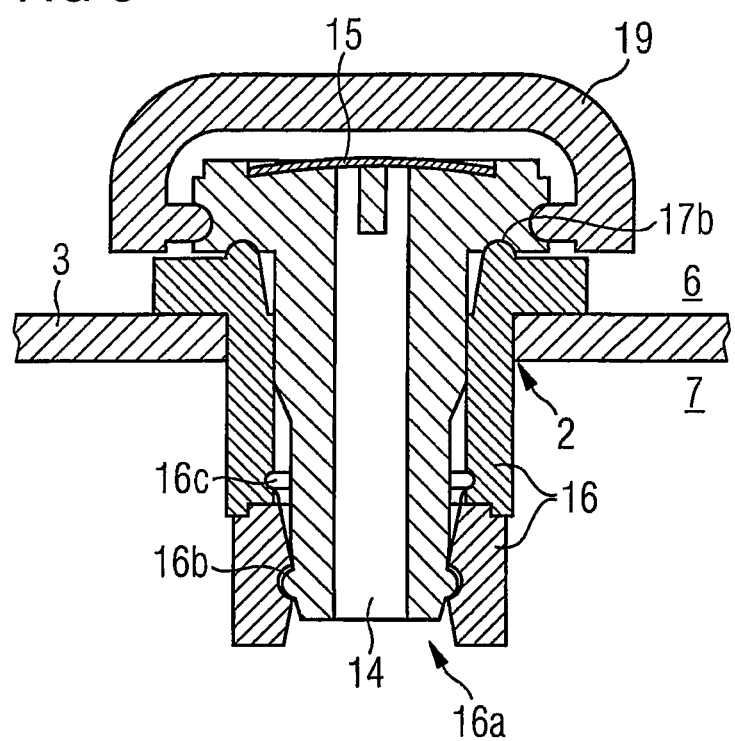
FIG. 3 is a cross-sectional view of the first embodiment of a venting device in an assembled state including a cap.
Figure 4:
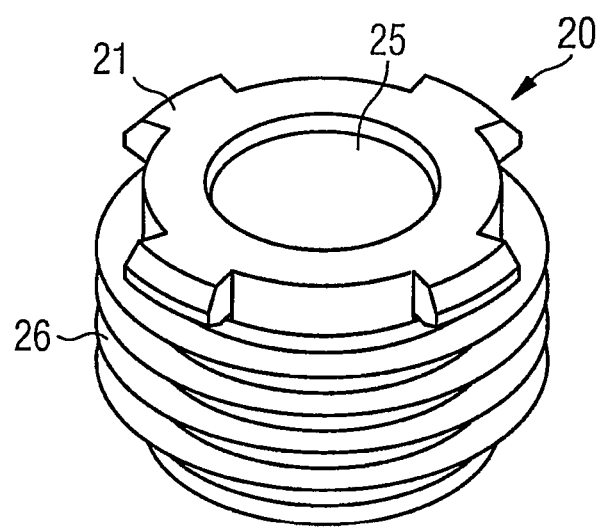
FIG. 4 is a perspective view of a second embodiment of a venting device.

In a first embodiment, a venting device as depicted in FIGS. 1 to 3 is provided. As seen in FIG. 1, the venting device 10 comprises a body 11 and an engagement section 16 consisting of a soft component and a hard component. The venting device 10 is polymeric and may be formed using injection molding techniques known in the art.

In FIG. 2a the hard component of the engagement section 16 consisting of a first polymer is shown. The hard component forms a shank 18 of the engagement section 16 of the venting device 10. The shank 18 has two diametrically opposed slits 18a enabling radial deformation of the shank 18, as in a dowel. Two radial extensions 18b are provided to engage with a flared end portion 17a of a soft sealing portion 17 shown in FIG. 2b.

FIG. 2b shows the soft component consisting of a second polymer which has a lower modulus of elasticity than the first polymer of the hard component. The soft component forms the sealing portion 17 of the engagement section 16. The sealing portion 17 is to be fitted over the shank 18 shown in FIG. 2a and engages with protrusions 18c on the shank 18 by means of snap-fitting holes 17c. The slit sections 18a of the shank 18 are then surrounded by the soft sealing portion 17. The shank 18 and the sealing portion 17 are already fitted together in the described manner at the manufacturing site.

The engagement section 16 is thus a composite structure comprising the sealing portion 17 and the shank 18 which are made from two materials differing in their moduli of elasticity. The shank 18 may be made from thermoplastic polymers or copolymers including but not limited to polypropylene, polyethylene, polyamide, polycarbonate which may have a modulus of elasticity of about 1700 MPa, while the sealing portion 17 is constructed using thermoplastic elastomers (TPE) having a lower modulus of elasticity and which may have a Shore A hardness of 50 to 75, preferably 60 to 70. Alternatively, the shank 18 and the sealing portion 17 may be integrally formed and comprise a relatively soft polymer material, such as a thermoplastic elastomer (TPE).

As shown in FIG. 2c, the body 11 of the venting device 10 comprises a head portion 13 and an insertion portion 12. The insertion portion 12 comprises at least one circumferential rib 11a. The insertion portion 12 has two sections 12a, 12b with different diameters separated by a tapered step 12c, which forms an angle 12d of about 160° with the section 12a of smaller diameter. The rib 11a is arranged on the section 12a having the smaller diameter. The two sections 12a, 12b of different diameters facilitate the insertion of the insertion portion 12 into the bore 16a of the engagement section 16, as will be described below. The body 11 is constructed of thermoplastic polymers or copolymers including but not limited to polypropylene, polyethylene, polyamide, polycarbonate, which may have a modulus of elasticity of about 1700 MPa.

As seen in FIG. 3, the body 11 has a passageway 14 for fluid communication between the interior 7 of the enclosure and the ambient atmosphere 6, whereby the passageway 14 is covered with a porous material 15 that is air permeable and liquid impermeable. The porous material 15 may be advantageously constructed of or at least comprise a PTFE membrane. The PTFE membrane may advantageously be rendered oleophobic by methods known in the art. Such methods are described in U.S. Pat. No. 5,116,650. The membrane may be supported by a support or backer material, if necessary.

As also shown in FIG. 3, the shank 18 comprises a bore 16a which is provided with a first groove 16b close to the distal end of the shank 18. The circumferential rib 11a on the insertion portion 12 of the body 11 may engage with the groove 16b when fully inserted in the bore 16a. As also seen in FIGS. 3 and 2b, the sealing portion 17 has a circumferential ridge 17b which is to provide axial sealing against the head portion when the insertion portion 12 is fully inserted into the bore 16a, i.e. when the rib 11a engages the groove 16b to create said interference fit. A cap 19 may be provided to cover and protect the porous material 15.

The venting device 10 can be pre-assembled by only partly inserting the insertion portion 12 into the bore 16a of the engagement section 16. The rib 11a then engages with a further groove 16c, which is located closer to the head portion 13 than the groove 16b. The sealing portion 17 is not widened yet in this pre-assembled state. It is advantageous to market the venting device 10 in this pre-assembled configuration because it is easy to handle as a unitary device and can be easily inserted into the opening 2 of the wall 3. In use, the insertion portion 12 may be fully inserted into the bore 16a until the rib 11a engages the other groove 16b to create the interference fit and the resisting force as described below.

In the following, the mounting of the pre-assembled venting device 10 in the opening 2 of the wall 3 will be described. First, the engagement section 16 is inserted into the opening 2 until the elastomeric sealing portion 17 comes to rest on the exterior surface of the enclosure wall 3. In a second step, the insertion portion 12 of the body 11 is fully inserted into the bore 16a of the engagement section 16 causing the larger diameter section 12b of the insertion portion 12 to interact with the shank 18, in particular the proximal end of the shank 18. Since the sections 12a, 12b of the insertion portion 12 are connected by the tapered step 12c, the insertion portion 12 slides easily into the bore 16a of the engagement section 16. Due to the fact that the larger diameter section 12b has a constant diameter, the shank 18 of the engagement section 16 and thus the sealing portion 17 are uniformly expanded when the larger diameter section 12b is fully inserted, whereby radial expansion of the proximal end of the shank 18 is enabled by the slit sections 18a. The expanded sealing portion 17 thus provides a constant contact pressure on the wall opening 2 irrespective of different wall thicknesses to thereby create sufficient radial sealing. Furthermore, because the insertion portion 12 pushes the shank 18 of the engagement section 16 outward, a locking force with respect to the opening 2 of the wall 3 is also created by the increased radial pressure that holds the venting device 10 in the wall opening.

Upon insertion of the insertion portion 12 in the engagement section 16, the rib 11a on the circumference of the smaller diameter section 12a is further advanced into the bore 16a and causes the distal end of the shank 18 to expand radially, which is enabled by the slit sections 16d. Once the insertion portion 12 reaches its final position, i.e. once it is fully inserted in the bore 16a, the rib 11a engages the groove 16b to cause said interference fit. In order to enhance this rib-groove engagement, particularly in case the shank 18 and the sealing portion 17 are integrally formed, the rib 11a and the groove 16b may be formed so as to allow a barb-like engagement. This may be achieved for example by a substantially triangular cross-section of the rib 11a and the groove. 16b. The rib-groove engagement generates an axial compressive force on the sealing portion 17 by the head 13 of the body 11, which allows for a seal to be created with the ridge 17b of the flared end portion 17a of the sealing portion 17. In addition, this engagement provides for an increase in the force required to engage and disengage the body 11 with and from the insertion portion 12, which in turn provides for an increase in the locking force with respect to the opening 2 of the wall 3 of the enclosure.

Due to the dowel-like configuration of the venting device 10 a mating force during insertion of the venting device 10 into an opening is low, that is, low forces are required to mount the venting device into a wall of an enclosure, whereas the locking force is sufficiently high to hold the venting device 10 within the opening. Furthermore, sufficient sealing in radial and axial directions is provided.

In this configuration, a single venting device 10 can be inserted into walls of enclosures of different thicknesses. By appropriately choosing the distance between the head and rib-groove engagement, wall thicknesses from one to four millimeters can be accommodated without reliance on thick compressible gaskets.

According to a second embodiment, a venting device 20 as shown in FIGS. 4 to 7 is provided. The venting device 20 is made from two polymeric components having different physical properties. The two components may be injection molded separately and joined to one another subsequently. Another possibility is to directly mold the second component onto the first component using two-component injection molding techniques known in the art, which, however, is more expensive and requires longer cycle times.

The venting device 20 has a body 21 with an insertion portion 22 and a head portion 23. The body 21 has a passageway 24 for fluid communication between the interior 7 of an enclosure and the external atmosphere 6.

The insertion portion 22 comprises two sections: a structural core section 27 and an elastic engagement section 26 comprising, in the embodiment shown herein, four radial engagement members 28. The structural core section 27 imparts mechanical stability to the venting device 20. The engagement members 28 are pliable and have a sealing function as well as a retaining function.

The core section 27 and the head portion 23 may be made from thermoplastic polymers or copolymers including but not limited to polyethylene, polypropylene, polycarbonate, polyester, polyamide, PBT (polybutylene terephthalate), which may have a modulus of elasticity of about 1700 MPa. The engagement section 26 may be made from a material that has a lower modulus of elasticity than the material of the core section 27. Suitable materials for the engagement section 26 include thermoplastic elastomeric (TPE) materials or rubber, which may have a Shore A hardness of 50 to 75, preferably 60 to 70.

Figure 6:
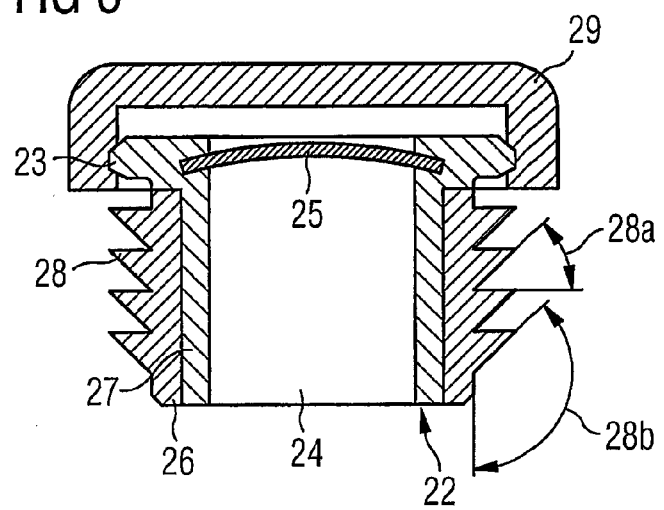
FIG. 6 is a cross-sectional view of the second embodiment of a venting device including a cap.

FIG. 6 shows the passageway 24 covered with a porous, air permeable, water impermeable material 25, which may comprise a PTFE membrane similar to the porous material 15 in the venting device 10 shown in FIG. 3. A cap 29 may be provided to cover and protect the porous material 25.

Figure 5:
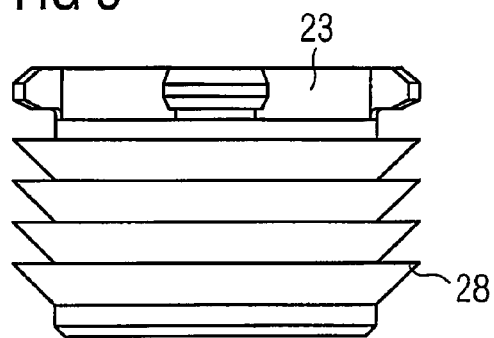
FIG. 5 is a side view of the second embodiment of a venting device.
Figure 7:
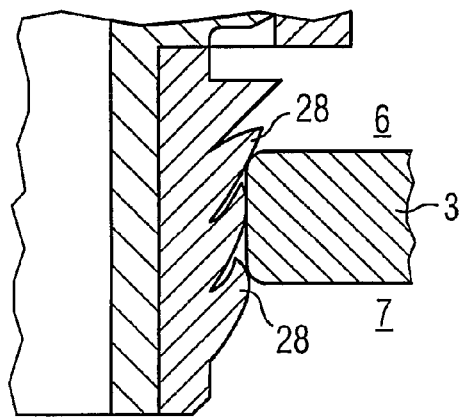
FIG. 7 is a cross-sectional view of the second embodiment of a venting device inserted in an opening of an enclosure.

As illustrated in FIGS. 5, 6, and 7, the engagement members 28 protrude radially from the engagement section 26. They are arranged with a pitch of about 1 mm, i.e. their radially free ends are spaced apart by about 1 mm. The engagement members 28 can take any shape or form and serve to form a liquid tight seal between the venting device 20 and the inside of the wall 3 of the enclosure. The engagement members 28 also aid in securing the venting device 20 in the wall opening. In the embodiment shown, the engagement members 28 have a substantially triangular cross-sectional shape and form an angle 28a between each other of about 45°. The angle 28b relative to the circumference of the engagement section 26 may amount to 135°.

Due to this shape and their pliability, as shown in FIG. 7, the engagement members 28 bend during insertion of the venting device 20 into an opening in the wall 3. They not only facilitate insertion into the opening but also make it difficult to withdraw the venting device 20 from the opening. Depending on the thickness of the wall 3 at least one engagement member 28 may pass the wall and return to its non-deformed state so as to act as a barb engaging with the interior surface of the wall 3. This increases the resisting force against withdrawal of the venting device 20 from the opening. Furthermore, tapering of the engagement members 28 towards their radially outer ends results in a small contact surface between the engagement members 28 and the inside of the wall 3 so that the engagement members 28 provide a high contact pressure and thus high sealing force.

Figure 8:
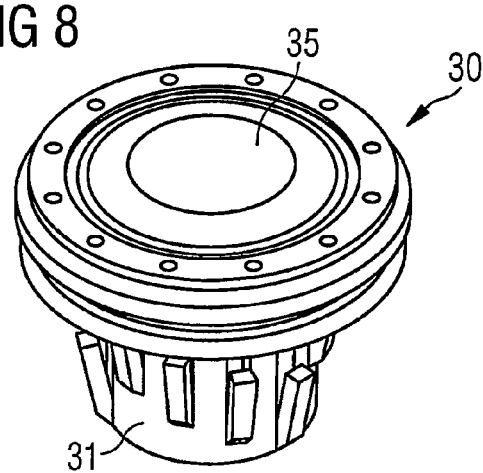
FIG. 8 is a perspective view of a third embodiment of a venting device.
Figure 9:
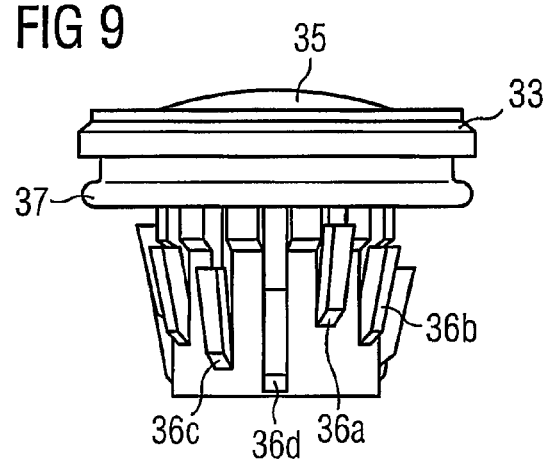
FIG. 9 is a side view of the third embodiment of a venting device.
Figure 10:
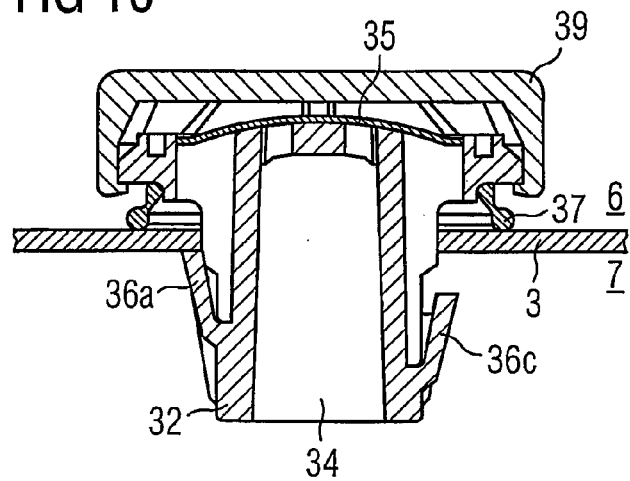
FIG. 10 is a cross-sectional view of the third embodiment of a venting device in an assembled state including a cap.

In a third embodiment, the invention comprises a venting device as shown in FIGS. 8, 9 and 10. The device 30 comprises a body 31 having an insertion portion 32 and a head portion 33. The insertion portion 32 is for insertion into an opening of a wall 3 and incorporates radial locking elements 36a-36d that hold the body 31 attached to the enclosure. The locking elements 36a-36d are situated at different distances from the head portion 33 to accommodate different wall thicknesses.

The body 31 may be made from thermoplastic polymers or copolymers including but not limited to polyethylene, polypropylene, polycarbonate, polyester, polyamide, PBT (polybutylene terephthalate), which may have a modulus of elasticity of about 1700 MPa. The body 31 may be formed using injection molding techniques known in the art.

As shown in FIGS. 9 and 10, radial locking elements 36a-36d are provided on the insertion portion 32 of the body 31. The locking elements 36a-36d extend radially from the insertion portion 32 at an acute angle so that they extend almost parallel to the insertion portion's longitudinal axis. The locking elements 36a-36d are located at differing distances from the head portion 33 of the body 31. At each distance, three locking elements 36a-36d are provided. In FIG. 10, the venting device 30 is attached to a relatively thin wall 3 of e.g. only 1 mm thickness by engagement of the first set of locking elements 36a which snap-fit behind the wall 3 upon insertion of the insertion portion 32 into the wall opening. If the venting device 30 were being in an enclosure having a thicker wall, locking engagement would be provided by a different one of the sets of locking elements. The remaining sets of locking elements do not contribute to the locking engagement as they are either radially compressed within the wall opening or extend into the enclosure at a distance from the wall.

Accordingly, a single venting device 30 can be securely inserted into walls of enclosures of different thicknesses. By appropriately choosing the head-to-locking-element distances, wall thicknesses from one to four millimeters can be accommodated without reliance on thick compressible gaskets. The relatively thin bellows-type gasket 37 is sufficient to accommodate all possible wall thicknesses in-between the intervals set by the distances between the sets of locking elements 36a-36d. The gasket 37 provides both a liquid tight seal between the exterior surface of the wall 3 and the head portion 33 of the venting device 30 and a counter force to the locking forces generated by the locking elements 36a-36d when they snap-fit behind the wall 3. By appropriate selection of the gasket thickness and compressibility properties, any wall thickness between one and four millimeters can be accommodated. The gasket 37 is thus provided as a profile gasket instead of an ordinary O-ring.

As shown in FIG. 10, the body 31 has a passageway 34 for fluid communication between the interior 7 of an enclosure and the ambient environment 6. The head portion 33 of the venting device 30 including the passageway 34 is covered with a porous material 35 that is air permeable and liquid impermeable. The porous material 35 allows for venting, but prevents intrusion of water and other liquids or contaminants. The porous material 35 may be a PTFE membrane as described in relation to the venting device 10 shown in FIG. 3, and, as above, may be attached to the body 31 using known techniques including thermal or ultrasonic welding or using an adhesive. The porous material 35 may also be integrated into the venting device 30 using insert molding techniques known in the art. A cap 39 may be provided to the head portion 33 of the venting device 30 to cover and protect the porous material 35.

What is claimed is:

1. A venting device for insertion into an opening of an enclosure having a wall with an interior surface and an exterior surface, the venting device comprising:
    a body having an insertion portion for insertion into the opening of the enclosure and a head portion, the body having a passageway extending through the insertion portion and the head portion for passage of a fluid from the enclosure to the ambient environment,
    an air permeable, water impermeable venting element covering the passageway, and
    an engagement section arranged circumferentially about the insertion portion for engagement with the wall of the enclosure, the engagement section being radially deformable so as to provide a resisting force against withdrawal from the wall when the venting device is inserted in the opening, wherein the engagement section is adapted to permit insertion of the venting device into openings of enclosures with different wall thicknesses,
    wherein the engagement section comprises a shank for insertion into the opening of the enclosure and a sealing portion, wherein a bore extends through the sealing portion and the shank and has at least one of at least one first groove and at least one first rib, wherein the insertion portion is for insertion into the bore of the engagement section and has a section comprising at least one of at least one rib and at least one groove for engagement with the at least one first groove or the at least one first rib, respectively, of the engagement section to create an interference fit between the engagement section and the shank.

2. The venting device according to claim 1, wherein the engagement section has a composite construction with the shank comprising a first polymer and the sealing portion comprising a second polymer, the first polymer having a first modulus of elasticity and the second polymer having a second modulus of elasticity lower than the first modulus.

3. The venting device according to claim 2, wherein at least a section at a proximal end of the shank is slit in an axial direction to provide radial elasticity.

4. The venting device according to claim 3, wherein the sealing portion is fitted over the shank to circumferentially surround the shank in an area of the slit section.

5. The venting device according to claim 2, wherein the sealing portion comprises a thermoplastic elastomer material or rubber and the shank comprises a thermoplastic polymer or copolymer selected from the group of polyethylene, polypropylene, polycarbonate, polyester, polyamide, polybutylene terephthalate.

6. The venting device according to claim 2, wherein the at least one first groove or the at least one first rib is arranged in the shank comprising the first polymer.

7. The venting device according to claim 1, wherein the sealing portion radially widens when the insertion portion is inserted in the bore to create said resisting force.

8. The venting device according to claim 1, wherein the engagement section comprises a flared end portion, preferably formed by the sealing portion.

9. The venting device according to claim 1, wherein the insertion portion is stepped, providing a first diameter which is smaller than a diameter of the bore, and a second diameter which is located closer to the head portion than the first diameter and which is larger than said diameter of the bore.

10. The venting device according to claim 1, wherein the step between the first and second diameters of the insertion portion is tapered.

11. The venting device according to claim 1, wherein the bore comprises at least one of at least one second groove and at least one second rib for engagement with the at least one and the at least one groove, respectively, of the insertion portion to hold the insertion portion within the bore when the insertion portion is only partly inserted therein.

12. The venting device according to claim 1, wherein at least one of the sealing portion and the head portion comprises at least one circumferential ridge facing the respective other of the head portion and the sealing portion to provide axial sealing between the sealing portion and the head portion when the insertion portion
is inserted in the bore and creates said interference fit.

13. The venting device according to claim 1, wherein the engagement section has at least one slit extending from a distal end of the engagement section and interrupting the at least one groove or rib of the bore to provide radial elasticity to the engagement section so as to facilitate said interference fit between the engagement section and the body of the venting device.

\* \* \* \* \*